United States Patent [19]

Wu et al.

[11] Patent Number: 5,432,073
[45] Date of Patent: Jul. 11, 1995

[54] METHOD FOR METAL DEPOSITION WITHOUT POISON VIA

[75] Inventors: Jiunn Y. Wu, Dou-Lio; Water Lur, Taipei, both of

[73] Assignee: United Microelectronics Corporation, Hsinchu, Taiwan

[21] Appl. No.: 126,717

[22] Filed: Sep. 27, 1993

[51] Int. Cl.6 .......................................... H01L 21/441
[52] U.S. Cl. ..................................... 437/195; 437/978
[58] Field of Search ............... 437/195, 978, 231, 238; 148/DIG. 43; 156/644, 643

[56] References Cited

U.S. PATENT DOCUMENTS

| 4,438,723 | 3/1989 | Cannella et al. | 118/718 |
|---|---|---|---|
| 4,897,153 | 1/1990 | Cole et al. | 156/646 |
| 4,951,601 | 7/1994 | Maydan et al. | 118/719 |
| 5,003,062 | 3/1991 | Yen | 437/231 |
| 5,089,441 | 2/1992 | Moslehi | 437/225 |
| 5,176,790 | 1/1993 | Arleo et al. | 156/644 |
| 5,180,689 | 1/1993 | Liu et al. | 437/228 |
| 5,200,030 | 4/1993 | Cho et al. | 156/657 |
| 5,252,515 | 10/1993 | Tsai et al. | 437/195 |
| 5,254,497 | 10/1993 | Liu | 437/195 |

OTHER PUBLICATIONS

Silicon Processing for the VLSI Era, vol. 2 by S. Wolf, 1990.

Primary Examiner—Olik Chaudhuri
Assistant Examiner—S. Mulpuri
Attorney, Agent, or Firm—George O. Saile

[57] ABSTRACT

A new method of metal deposition in an integrated circuit is described. Semiconductor device structures are provided in and on a semiconductor substrate. At least one patterned conductive layer is provided for contacting the active elements of the device structures. The surface of the patterned conductive layer structure is irregular with horizontal and vertical components. An insulating layer is provided over the irregular structure patterned conductive layer. The insulator layer is covered with at least one spin-on-glass layer to fill the valleys of the irregular structure. The spin-on-glass layer is baked and cured, then covered with a second insulator layer. The spin-on-glass and two insulator layers are etched to provide openings to the patterned conductive layer wherein the etching is performed at low temperature so as to decrease the possibility of device degradation. The exposed spin-on-glass layer within the openings is degassed at a high temperature. A metal layer is sputtered over the surface of the substrate and filling the openings to the conductive layer and patterned to complete the metal deposition in the manufacture of integrated circuits.

4 Claims, 1 Drawing Sheet

METHOD FOR METAL DEPOSITION WITHOUT POISON VIA

BACKGROUND OF THE INVENTION (1) Field of the Invention

The invention relates to a method of metal deposition in the manufacture of an integrated circuit device, and more particularly, to a method of metal deposition without poison via caused by outgassing from spin-on-glass in the manufacture of an integrated circuit.

(2) Description of the Prior Art

As integrated circuit technology is extended into the deep submicron regime, it is more difficult to fill in high aspect ratio via openings during metallization. A plasma-enhanced chemically vapor deposited (PECVD) silicon oxide, spin-on-glass, PECVD silicon oxide sandwich structure is usually used as the inter-metal dielectric in the manufacture of integrated circuits. During the deposition of higher level metal layers, the outgassing of moisture from the spin-on-glass around the via walls causes poison via; that is, poor step coverage of metal in the vias. This results in connection failure between the metal layers. U.S. Pat. No. 5,003,062 to Yen describes this outgassing problem and some methods to solve the problem. The conventional method for higher metal deposition involves the steps of 1) degassing of the spin-on-glass layer at high temperatures, 2) radio frequency (rf) etching to remove residual polymer and native metal oxide, and 3) metal sputtering. However, during step 1), only the surface layer of the spin-on-glass material is cured. This "dry" layer is then etched off during the subsequent step 2), leaving a new spin-on-glass surface full of moisture ready for the metal deposition. Poison via is inevitable. In addition, the high temperature of rf etching causes device degradation such as threshold voltage shift.

SUMMARY OF THE INVENTION

A principal object of the present invention is to provide an effective and very manufacturable method of metal deposition without poison via in an integrated circuit.

Another object of the present invention is to provide a method of metal deposition with better step coverage and less device degradation than the conventional method.

In accordance with the objects of this invention a new method of metal deposition in an integrated circuit is achieved. Semiconductor device structures are provided in and on a semiconductor substrate. At least one patterned conductive layer is provided for contacting the active elements of the device structures. The surface of the patterned conductive layer structure is irregular with horizontal and vertical components. An insulating layer is provided over the irregular structure patterned conductive layer. The insulator layer is covered with at least one spin-on-glass layer to fill the valleys of the irregular structure. The spin-on-glass layer is baked and cured, then covered with a second insulator layer. The spin-on-glass and two insulator layers are etched to provide openings to the patterned conductive layer wherein the etching is performed at low temperature so as to decrease the possibility of device degradation. The exposed spin-on-glass layer within the openings is degassed at a high temperature. A metal layer is sputtered over the surface of the substrate and filling the openings to the conductive layer and patterned to complete the metal deposition in the manufacture of integrated circuits.

BRIEF DESCRIPTION OF THE DRAWINGS

In the accompanying drawings forming a material part of this description, there is shown.

DESCRIPTION OF THE PREFERRED EMBODIMENTS

Figure 1:
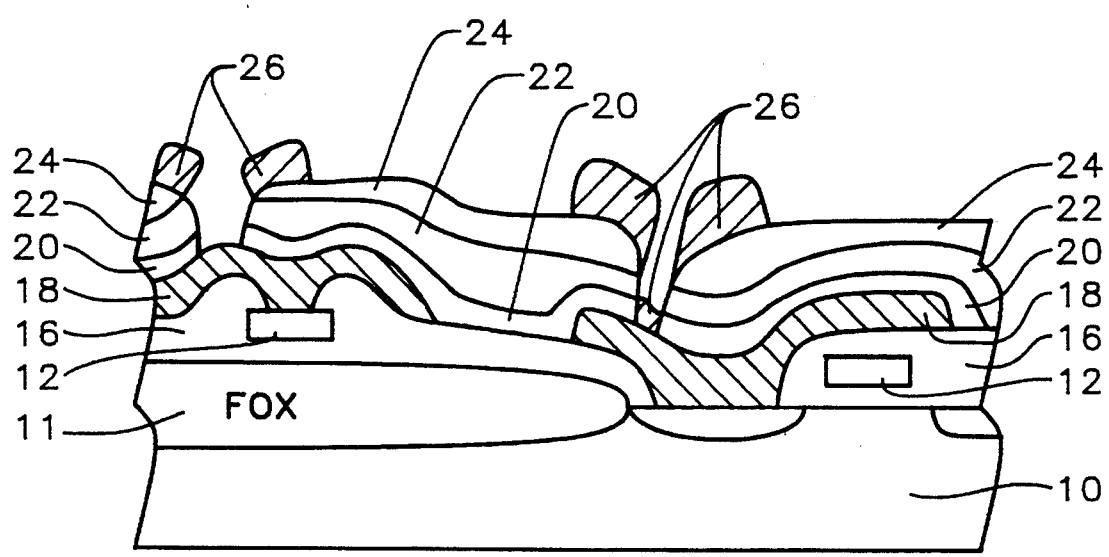
FIG. 1 schematically illustrates in cross-sectional representation a partially completed integrated circuit of the prior art indicating the problems to be overcome by the present invention.

Referring now more particularly to FIG. 1, there is shown an illustration of a partially completed integrated circuit. Field oxide regions 11 have been formed in the semiconductor substrate 10. Gate electrodes 12 have been formed over the gate dielectric on the silicon substrate. A passivation layer 16 of silicon oxide and/or borophosphosilicate glass covers the devices in and on the substrate. Metal layer 18 has been deposited and etched to form the desired pattern. Layer 20 is the first insulator layer of the inter-metal dielectric sandwich, followed by the spin-on-glass layer 22, and the top insulator layer 24. Openings have been etched through the inter-metal dielectric to the first metal layer 18. The second metal layer 26 has been sputter deposited and patterned. However, it can be seen that there is poor step coverage on the sides of the openings resulting from outgassing from the exposed spin-on-glass layer on the sidewalls of the via openings. This results in connection failure between the two metal layers.

Figure 2:
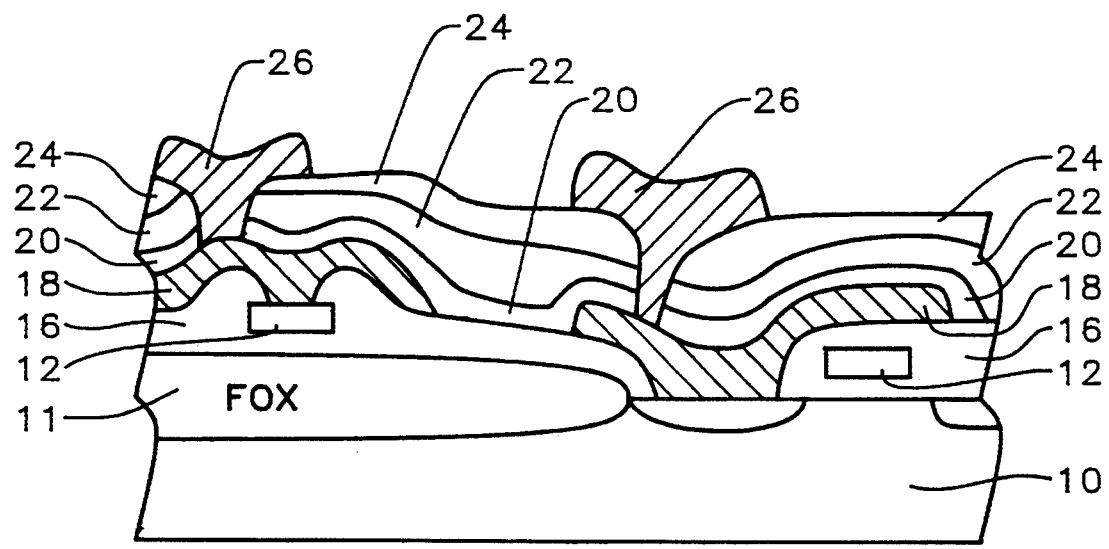
FIG. 2 schematically illustrates in cross-sectional representation a preferred embodiment of the present invention.

Referring now to FIG. 2, there is shown a portion of a partially completed integrated circuit of the present invention. The semiconductor substrate 10 is preferably composed of monocrystalline silicon. Gate electrode patterns 12 have been formed on the surface of the substrate 10 as is conventional in the art. A passivation or insulating layer 16 is then formed over the surfaces of the patterns. This layer may be composed of multilayers such as a thin layer of silicon oxide and a much thicker layer of borophosphosilicate glass, phosphosilicate glass or similar insulating layer. The total operational thickness of these layers is between about 4000 to 10,000 Angstroms. These layers are typically deposited by chemical vapor deposition (CVD).

Contact openings are formed through the insulating structure to the semiconductor substrate 10. Conventional lithography and etching techniques are used to form this pattern of openings.

The first metallurgy contact layer 18 is now deposited over the surface of the structure and within the pattern of via openings. The metallurgy is preferably physical vapor deposited (PVD) to a thickness of between about 4000 to 8000 Angstroms. The metallurgy is now patterned into the desired conductive lines by conventional lithography and etching techniques to form the pattern of metal layer 18 in FIG. 2.

Now the inter-metal dielectric sandwich is formed. The first dielectric layer 20 is composed of silicon oxide and is deposited by CVD to a thickness of between about 1000 to 5000 Angstroms. A siloxane or silicate spin-on-glass coating 22 is applied. The spin-on-glass material suspended in the vehicle or solvent is deposited onto the semiconductor wafer surface and uniformly spread thereover by the action of spinning the wafer. The material fills the indentations in the integrated circuit wafer surface, that is planarization.

Most of the vehicle or solvent is driven off by a low temperature baking step, typically on a hot plate at a temperature of between about 80° to 250° C. A double coat of the spin-on-glass material may be applied. The total thickness of one or two coats of the siloxane or silicate is about 1000 to 4000 Angstroms as measured on a bare wafer. The spin-on-glass layer is cured in a furnace at a temperature of between about 400° to 450° C. for 20 to 60 minutes.

Finally, the top layer of the inter-metal dielectric sandwich is deposited. This layer 24 may be composed of silicon oxide or silicon nitride and is deposited by CVD to a thickness of between about 2000 to 5000 Angstroms.

Conventional lithography and etching techniques are used to provide a pattern of via openings through the inter-metal dielectric to the first metal layer 18. A residual polymer is formed during the metal via etch that is difficult to remove using a normal photoresist removal solution. It is thought that high temperatures over 250° C., scorching of the photoresist, and a charging effect stimulate a linking reaction between the photoresist molecules to form the residual polymer. A radio frequency argon plasma etch is performed with a bias voltage of between about 100 to 1000 volts to remove the residual polymer and native metal oxide on the surface of the first metal layer 18. This etching is performed at low temperatures of between about 0° to 100° C. rather than the conventional higher temperatures of between about 300° to 450° C. Conventionally, the radio frequency etch is performed after a 300° to 450° C. degassing. The lower temperatures used in the present invention result in a lower possibility of device degradations such as threshold voltage shift.

Degassing from the exposed spin-on-glass layer 22 within the via openings is performed at this point after the radio frequency etch at a temperature of between about 300° to 500° C. for about 30 to 90 seconds in a vacuum of less than about 10 mtorr. If the degassing were to be performed before the rf etch, as is conventional in the prior art, the portion of the spin-on-glass layer that had been degassed would be etched away during the subsequent rf etch leaving exposed a portion of the spin-on-glass layer that is still full of moisture. This would result in poison via. However, in the present invention, the degassing step is performed after the rf etch, so the portion of the spin-on-glass layer that is degassed will be that which contacts the metal to be sputtered into the via openings. Modern metal sputtering machines have multiple chambers so that the rf etch step can be performed first before the degassing step without additional metal oxide buildup before the metal can be sputtered.

Finally, the second metal layer 26 is sputter deposited over the surface of the substrate and within the via openings. Step coverage is much improved with this method resulting in no poison viaso Scanning Electron Microscope (SEM) pictures show improvement especially in step coverage in the process of the invention over the conventional process of the prior art. The metal layer 26 is patterned and the integrated circuit is completed as is conventional in the art.

While the invention has been particularly shown and described with reference to the preferred embodiments thereof, it will be understood by those skilled in the art that various changes in form and details may be made without departing from the spirit and scope of the invention.

What is claimed is:

1. The method of metal deposition in the manufacture of integrated circuits comprising:
    providing semiconductor device structures in and on a semiconductor substrate;
    providing at least one patterned conductive layer for contacting the active elements of said device structures;
    the surface of said patterned conductive layer structure is irregular with horizontal and vertical components;
    providing a layer of an insulator over said irregular structure patterned conductive layer;
    covering said insulator layer with at least one spin-on-glass layer to fill the valleys of said irregular structure and baking and curing said at least one spin-on-glass layer;
    covering said at least one spin-on-glass layer with a second insulator layer;
    forming via openings through said at least one spin-on-glass and two insulator layers to said patterned conductive layer;
    etching within said via openings to remove polymer and oxide formed on the surface of said exposed patterned conductive layer wherein said etching is a radio frequency argon plasma etch with bias voltage of between about 100 and 1000 volts and is performed at a low temperature of between about 0° to 100° C.;
    thereafter degassing said exposed at least one spin-on-glass layer within said via openings at a high temperature between about 300° to 500° C.;
    sputtering a metal layer over the surface of said substrate and filling said via openings; and
    patterning said metal layer to complete said metal deposition in the manufacture of integrated circuits.

2. The method of claim 1 wherein said etching, degassing, and sputtering are performed within a multi-chamber sputtering machine so that additional oxide does not form on said exposed conductive patterned layer after said etching and before said sputtering is performed.

3. The method of metal deposition in the manufacture of integrated circuits comprising:
    providing semiconductor device structures in and on a semiconductor substrate;
    providing at least one patterned conductive layer for contacting the active elements of said device structures;
    the surface of said patterned conductive layer structure is irregular with horizontal and vertical components;
    providing a layer of an insulator over said irregular structure patterned conductive layer;
    covering said insulator layer with at least one spin-on-glass layer to fill the valleys of said irregular structure and baking and curing said at least one spin-on-glass layer;
    covering said at least one spin-on-glass layer with a second insulator layer;
    forming via openings through said at least one spin-on-glass and two insulator layers to said patterned conductive layer wherein a residual polymer is formed on the sidewalls of said via openings and wherein an oxide is formed on the exposed surface of said patterned conductive layer;

etching within said via openings to remove said residual polymer and said oxide wherein said etching is a radio frequency argon plasma etch with bias voltage of between about 100 and 1000 volts and is performed at a low temperature of between about 0° to 100° C.;

thereafter degassing said exposed at least one spin-on-glass layer within said via openings at a high temperature of between about 300° to 500° C.;

sputtering a metal layer over the surface of said substrate and filling said via openings; and patterning said metal layer to complete said metal deposition in the manufacture of integrated circuits.

4. The method of claim 3 wherein said etching, degassing, and sputtering are performed within a multi-chamber sputtering machine so that additional oxide does not form on said exposed conductive patterned layer after said etching and before said sputtering is performed.

* * * * *